(12) United States Patent
Eckblad et al.

(10) Patent No.: US 7,035,107 B2
(45) Date of Patent: Apr. 25, 2006

(54) HIGH SERVICEABILITY HEATSINK RETAINER METHOD AND APPARATUS

(75) Inventors: Michael Z. Eckblad, Auburn, WA (US); Eric D. McAfee, Dupont, WA (US); Andy F. Thompson, University Place, WA (US); Glen P. Gordon, Graham, WA (US)

(73) Assignee: Intel Corporation, Santa Clara, CA (US)

( * ) Notice: Subject to any disclaimer, the term of this patent is extended or adjusted under 35 U.S.C. 154(b) by 245 days.

(21) Appl. No.: 10/618,204

(22) Filed: Jul. 11, 2003

(65) Prior Publication Data

US 2005/0007743 A1    Jan. 13, 2005

(51) Int. Cl.
*H05K 7/20* (2006.01)

(52) U.S. Cl. ...................... 361/719; 361/709

(58) Field of Classification Search ............... 361/683, 361/704, 709, 715, 718, 719, 720, 726, 728, 361/736, 737, 740, 760, 764; 165/80.2, 80.3, 165/80.4, 165, 185; 248/316.1, 316.7, 505, 248/510; 257/706–727
See application file for complete search history.

(56) References Cited

U.S. PATENT DOCUMENTS

| | | | | |
|---|---|---|---|---|
| 6,082,440 A | * | 7/2000 | Clemens et al. | 165/80.3 |
| 6,219,239 B1 | * | 4/2001 | Mellberg et al. | 361/704 |
| 6,243,265 B1 | * | 6/2001 | Wong et al. | 361/704 |
| 6,381,836 B1 | * | 5/2002 | Lauruhn et al. | 29/831 |
| 6,400,572 B1 | * | 6/2002 | Wu | 361/704 |
| 6,449,154 B1 | * | 9/2002 | Yoneyama et al. | 361/704 |
| 6,450,248 B1 | * | 9/2002 | Chang | 165/80.3 |
| 6,496,371 B1 | * | 12/2002 | Winkel et al. | 361/703 |
| 6,522,545 B1 | * | 2/2003 | Shia et al. | 361/704 |
| 6,542,367 B1 | * | 4/2003 | Shia et al. | 361/703 |
| 6,563,213 B1 | * | 5/2003 | Wong et al. | 257/727 |
| 6,648,664 B1 | * | 11/2003 | McHugh et al. | 439/331 |
| 6,735,085 B1 | * | 5/2004 | McHugh et al. | 361/719 |

* cited by examiner

*Primary Examiner*—Lisa Lea-Edmonds
*Assistant Examiner*—Ingrid Wright
(74) *Attorney, Agent, or Firm*—Jeffrey B. Huter

(57) ABSTRACT

A method and an apparatus for releasably retaining a heatsink in contact with an IC attached to a circuitboard in which the heatsink is inserted into a spring cage that is pivotally connected with an actuation lever, wherein at least a pair of spring tabs engage the heatsink to press a thermal conductive surface of the heatsink towards a circuitboard and an IC attached to the circuitboard when the combination of the heatsink, actuation lever and spring cage are inserted into the rectangular frame of a retention module mounted on the circuitboard so as to surround the IC and the lever portion of the actuation lever is pivoted towards the spring cage so as to cause retention points on the actuator portions of the actuation lever and on the rectangular frame of the spring cage to engage corresponding retention points on the rectangular frame of the retention module.

23 Claims, 9 Drawing Sheets

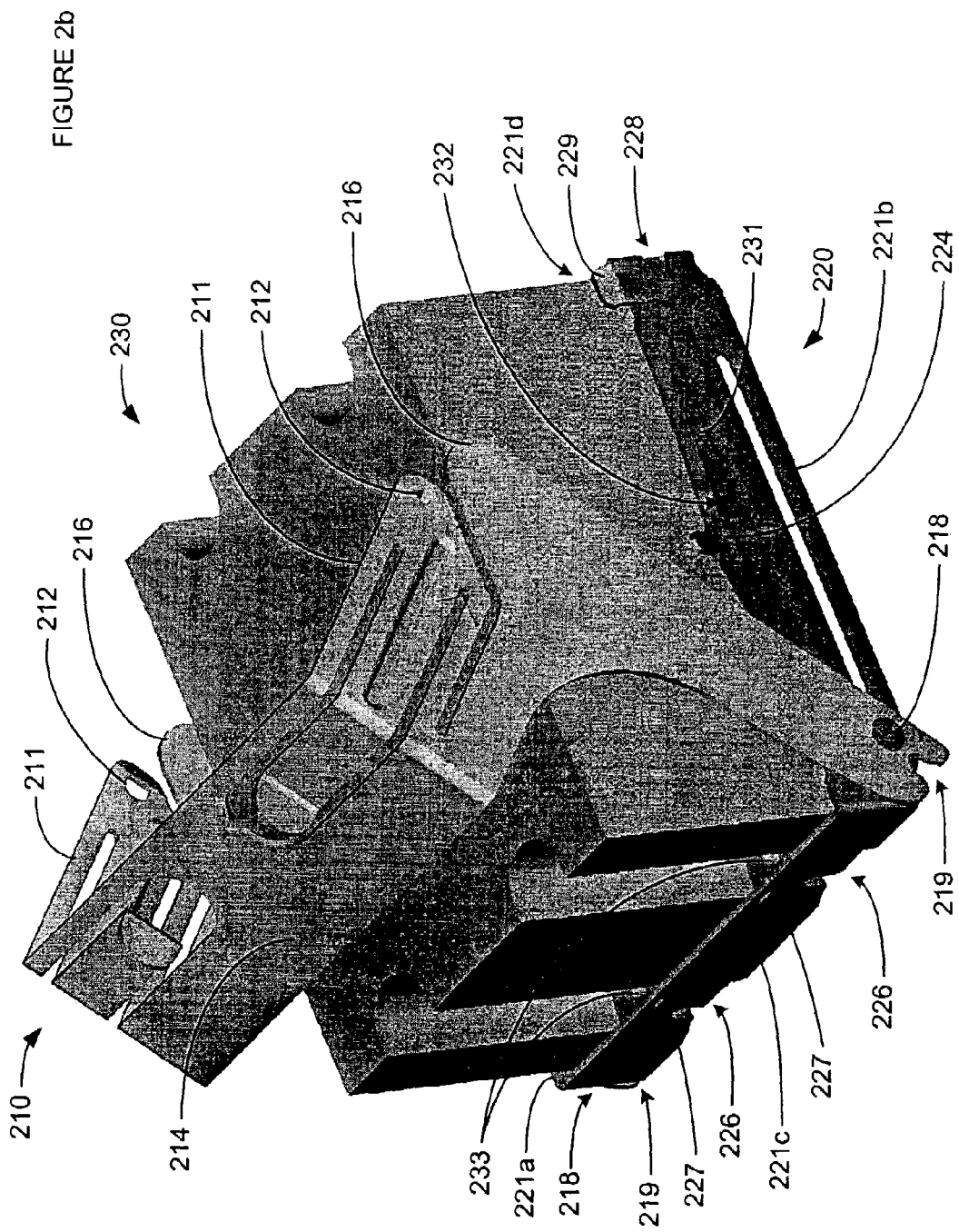

HIGH SERVICEABILITY HEATSINK RETAINER METHOD AND APPARATUS

BACKGROUND

As part of continuing efforts to increase the speed and functionality of integrated circuits (ICs) such as central processing units (CPUs), there has been a continuing need to dissipate ever greater quantities of heat generated by such ICs during normal operation. This has required the use of heatsinks of ever larger design and using materials that are ever more effective at conducting heat away from such ICs (e.g., substituting copper for aluminum). The result has been that heatsinks have become heavier and heavier.

Until recently, it was acceptable to use a "spring clip" of a type that held a surface of a heatsink in contact with a surface of such ICs by hooking onto plastic tabs molded into the sides of the sockets in which such ICs were installed. Early on, for small and lightweight heatsinks (often made of aluminum), the plastic tabs proved to be more than adequate to retain a heatsink in contact with such ICs. However, as heatsinks have become necessarily heavier, this use of plastic tabs has been deemed undesirable, because the plastic material is often to not be strong enough to resist breaking, shearing or resisting other catastrophic failure when shock or vibration causes a heavier heatsink to be ripped away from contact with such ICs. Such mechanisms also often did not retain a heatsink in contact with such an IC with an even distribution of force across the area of contact between the heatsink and the package of such an IC with the result that the effectiveness of the conduction of heat from the IC to the heatsink could be compromised.

To improve upon the use of plastic tabs and a spring clip, it has become common practice to form a set of holes through the circuitboard around the location at which sockets for such ICs are attached to the circuitboard, and using a combination of threaded fasteners including nuts, bolts and/or plates with threaded holes to retain heavier heatsinks in contact with such ICs. However, with such approaches installing or removing a heatsink often requires the use of a screwdriver or other tools, and often requires that the circuitboard be removed from the chassis into which it is installed to gain access to the side opposite of that to which the socket is attached in order to tighten or loosen such threaded fasteners.

In some cases where plates with threaded holes are employed, the plate is shaped so as to press against the circuitboard at a location underneath the socket for the IC on the side opposite that to which the socket is attached. Unfortunately, the shape of some of these plates and the manner in which they are engaged by bolts can cause the plate to induce warpage of the circuitboard if an IC is not installed in the socket. Such a use of threaded fasteners also often requires that the person installing a heatsink must make an effort to tighten each of the bolts with a similar amount of torque so that the heatsink will be retained in contact with the IC with an even distribution of force across the area of contact between the heatsink and the package of the IC. This may pose little problem where a person of some skill undertakes to do the tightening of the bolts, but this can become highly problematic where an unskilled end user of an electronic device into which the IC and heatsink are being installed undertakes to do this tightening. There is also a risk that one or more bolts could be overtightened, resulting in damage to the IC and/or the circuitboard.

BRIEF DESCRIPTION OF THE DRAWINGS

The objects, features, and advantages of the invention as hereinafter claimed will be apparent to one skilled in the art in view of the following detailed description in which:

FIGS. 2*a*, 2*b* and 2*c* depict embodiments of releasably retaining a heatsink.

DETAILED DESCRIPTION

Although numerous details are set forth for purposes of explanation and to provide a thorough understanding in the following description, it will be apparent to those skilled in the art that these specific details are not required in order to practice embodiments of the invention as hereinafter claimed. For example, although embodiments are discussed with reference to an IC device such as a CPU in a computer system, it will be readily apparent to those skilled in the art that teachings of the present invention may be applied to other forms of IC installed within other type of electronic devices.

Apparatus for removably retaining a heatsink package in contact with an IC in an easily releasable manner and with an even distribution of force across the contact area between the IC and heatsink is disclosed. Specifically, a retention mechanism mounted to a circuitboard, a frame and spring cage about the periphery of a portion of a heatsink, and a hand-operable actuation lever not requiring tools to be used.

Figure 1A:
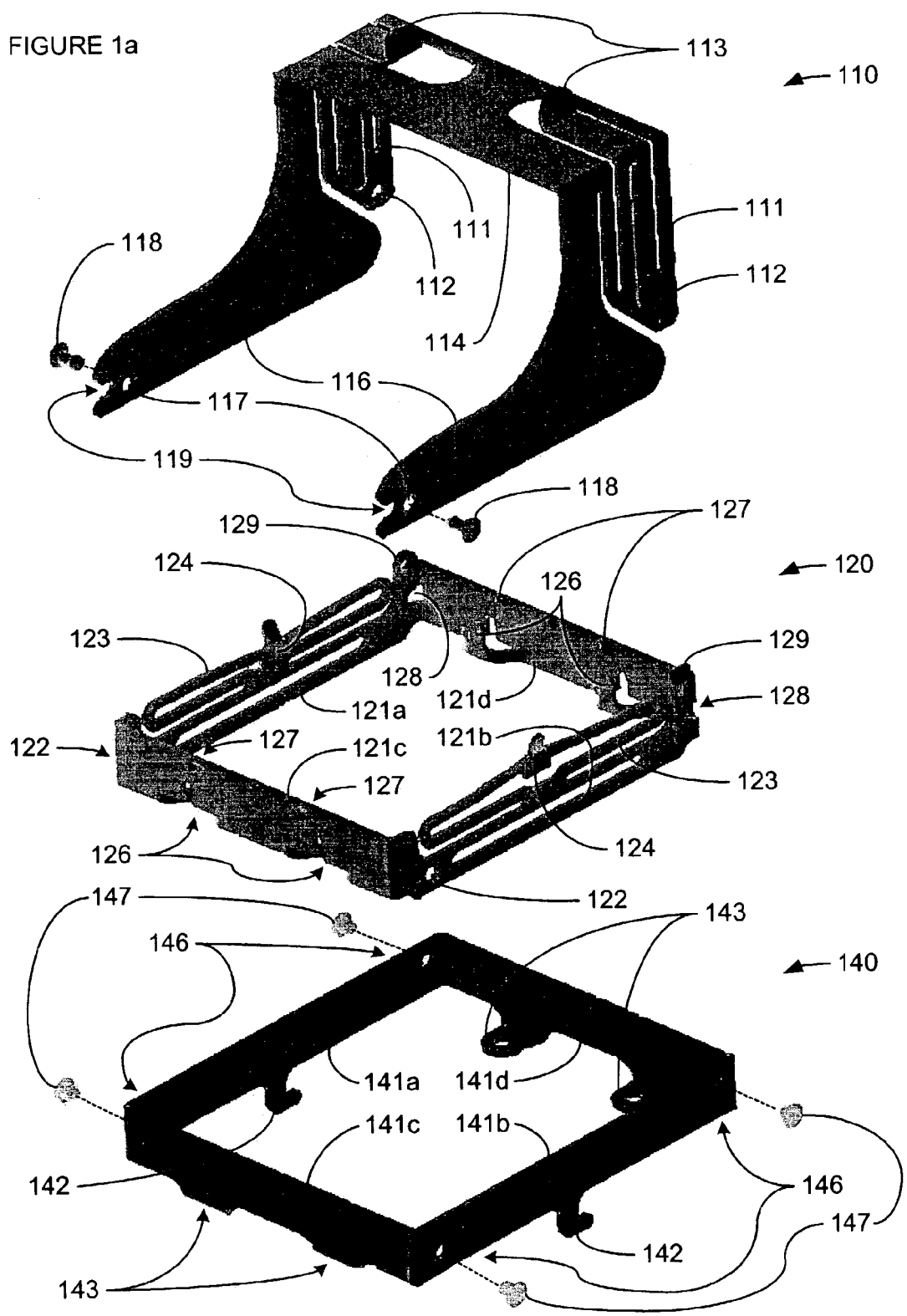
FIGS. 1*a* and 1*b* depict embodiments for assembly of a heatsink retainer.
Figure 1B:
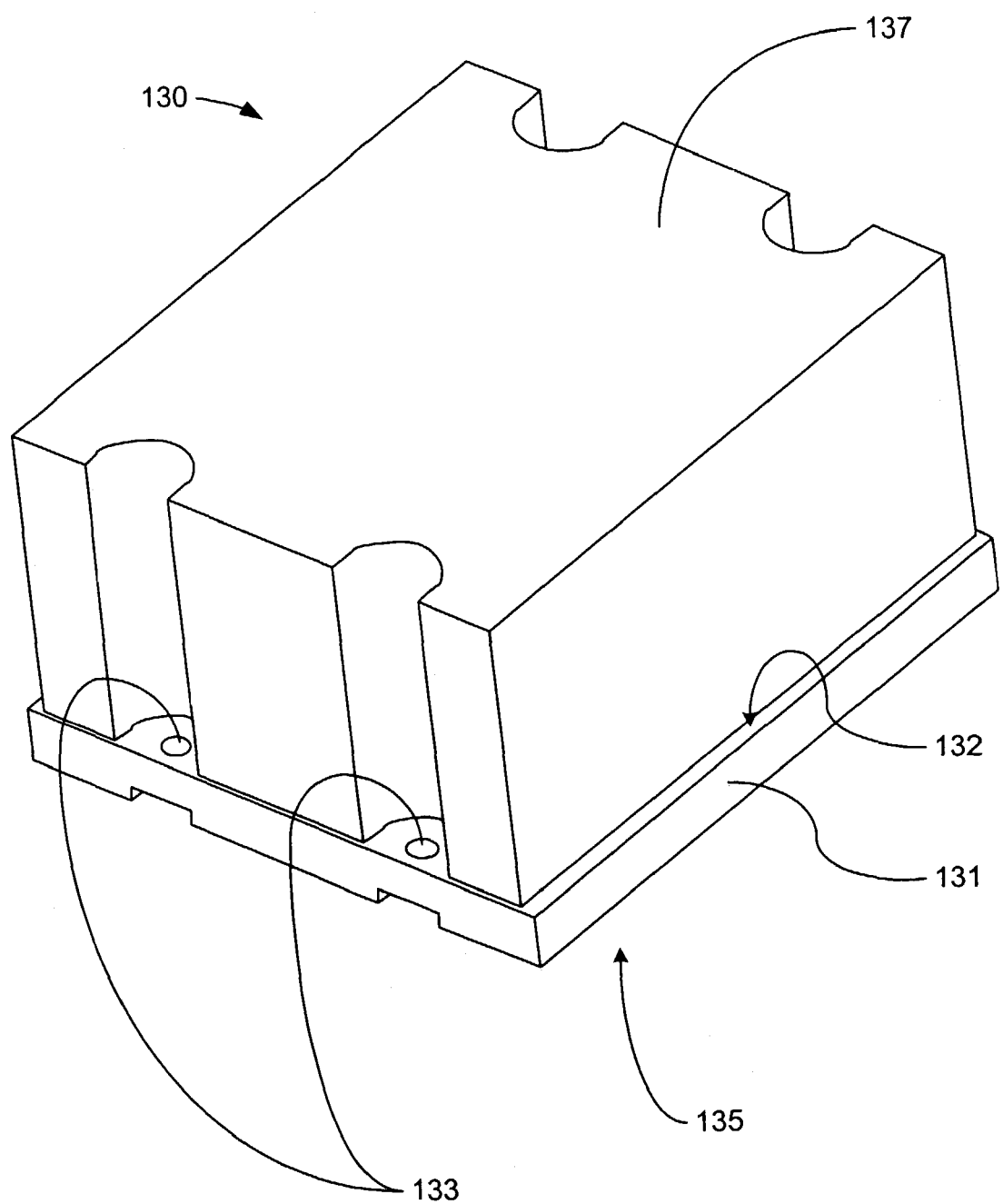

FIGS. 1*a* and 1*b* depict embodiments of an assembly for a heatsink retainer. Assembly 100 is made up principally of actuation lever 110, spring cage 120 and retention module 140. Actuation lever 110, spring cage 120 and retention module 140 cooperate to forcibly press a thermal conductive surface of a heatsink, perhaps thermal conductive surface 135 of heatsink 130, against a surface of the package of an IC attached to a circuitboard (neither shown) to which retention module 140 may also be attached.

Retention module 140 is made up principally of a four-sided frame having frame portions 141*a*–141*d*. Formed through each end of frame portions 141*a* and 141*b* are retention openings 146, providing retention points to receive various possible forms of retention hardware to aid in engaging actuation lever 110 and spring cage 120. In one embodiment, a form of retention hardware received through retention openings 146 is pins 147, which may be inserted through and secured within each of retention openings 146 by welding. Alternatively, in other embodiments, various forms of threaded fasteners, fasteners with expanding portions along a shaft, rivets, etc., may be inserted through each of retention openings 146. In some embodiments, retention module 140 may be attached to a circuitboard (not shown) with circuitboard tabs 142. In other embodiments, retention module 140 may be attached to a circuitboard with any of a variety of fasteners inserted through openings formed through both circuitboard tabs 143 and a circuitboard at locations underneath each of circuitboard tabs 143. Still other embodiments may employ any a variety of known ways to attach retention module 140 to a circuitboard, as those skilled in the art will readily recognize.

Spring cage 120 is principally made up of a four-sided frame having frame portions 121*a*–121*d* and a pair of spring portions 123, each of spring portions; 123 being attached to one of frame portions 121a and 121b. Formed through the end of each of frame portions 121a and 121b that connects with frame portion 121c are pivot openings 122 to aid in forming a pivoting connection with actuation lever 110. Where the other end of each of frame portions 121a and 121b connect with each end of frame portion 121d, forming a pair of adjacent corners, retention notches 128 are formed, providing retention points to cooperate with whatever hardware is inserted through two of retention openings 146 of retention frame 140 to engage retention module 140. Heatsink spring tabs 124 are formed on each of spring portions 123 to cooperate with heatsink hard tabs 126 formed on each of frame portions 121c and 121d to releasably retain a heatsink, perhaps heatsink 130.

In some embodiments, heatsink tabs 127 may also be formed in frame portions 121c and 121d to aid in releasably retaining a heatsink. In some variations of these embodiments, heatsink tabs 127 may be formed by punching and/or stamping frame portions 121c and 121d to form dimples protruding towards the center of spring cage 120, as shown, or by any of a variety of other methods as those skilled in the art will readily recognize.

Heatsink 130 is presented as a general example of a form of heatsink that may be releasably retained via assembly 100. Heat release portion 137 is made up largely of a multitude of fins and/or other projections (not explicitly shown) to provide a large quantity of surface area by which heatsink 130 releases heat imparted to heatsink 130 by an IC in contact with thermal conductive surface 135 of heatsink 130 into the surrounding air. Heat release portion 137 may also incorporate one or more of an electric fan, heat pipe, liquid coolant heat exchange apparatus, etc., however, the exact features and configuration of heat release portion 137 are not important to the practice of the present invention as hereinafter claimed. Heat release portion 137 is mounted atop heatsink base 131 which provides thermal conductive surface 135 to make contact with an IC. Heatsink base 131 also provides ledge 132 and retention openings 133 formed through heatsink base 131 to engage heatsink spring tabs 124 and heatsink,hard tabs 126, respectively, of spring cage 120. When heatsink 130 is attached to spring cage 120, portions of heatsink hard tabs 126 protrude upward into retention openings 133 and spring portions 123 of spring cage 120 are positioned alongside the periphery of heatsink base 131 with heatsink spring tabs 124 pressing against ledge 132 of heatsink 130 and thereby pressing thermal conductive surface 135 of heatsink 130 towards portions of heatsink hard tabs 126. Although heatsink 130 is depicted as being largely box-like in shape, it will be readily understood by those skilled in the art that heatsink 130 may be of any one of a great many possible shapes and configurations.

Actuation lever 110 is made up principally of actuator portions 116 connected together at one end by lever portion 114. On the other end of each of actuator portions 116 are pivot openings 117 to cooperate with pivot openings 122 of spring cage 120 in forming a pivoting connection with spring cage 120. In some embodiments, a form of pivot hardware is received through pivot openings 117 and 122. In one such embodiment, pins 118 may be inserted through and secured within each of pivot openings 117 by welding in a position whereby pins 118 protrude enough to enter into and engage pivot openings 122 when spring cage 120 and actuation lever 110 are assembled together. In another such embodiment, a pierced extrusion is formed at the location of pivot openings 122 of spring cage 120 (with the result that the pierced extrusion takes the place of any separate pivot hardware), and that are staked into countersinking at the location of pivot openings 117 on the actuation lever, thereby providing pivoting point with a double-flush engagement. Alternatively, in still other embodiments, various forms of rivets, threaded fasteners, fasteners with expanding portions along a shaft, or other forms of pivot hardware may be inserted through both pivot openings 117 and 122. Also on the same end of each of actuator portions 116 as pivot openings 117 are retention notches 119, providing retention points and cooperating with whatever hardware is inserted through two of retention openings 146 of retention frame 140 to engage retention module 140.

In some embodiments latch portions 111 are attached to lever portion 114, providing latch levers 113 to aid in releasably latching actuation lever 110 to spring cage 120 by way of latch tabs 112 formed on one end of each of latch portions 111 of actuation lever 110 releasably engaging latch tabs 129 formed at the same corners of spring cage 120 where retention notches 128 are also formed. In some variations of these embodiments, latch tabs 112 and 129 may be formed by punching and/or stamping latch portions 111 and/or portions of spring cage 120 to form dimples and corresponding openings, as shown, or by any of a variety of other methods as those skilled in the art will readily recognize.

Figure 2A:
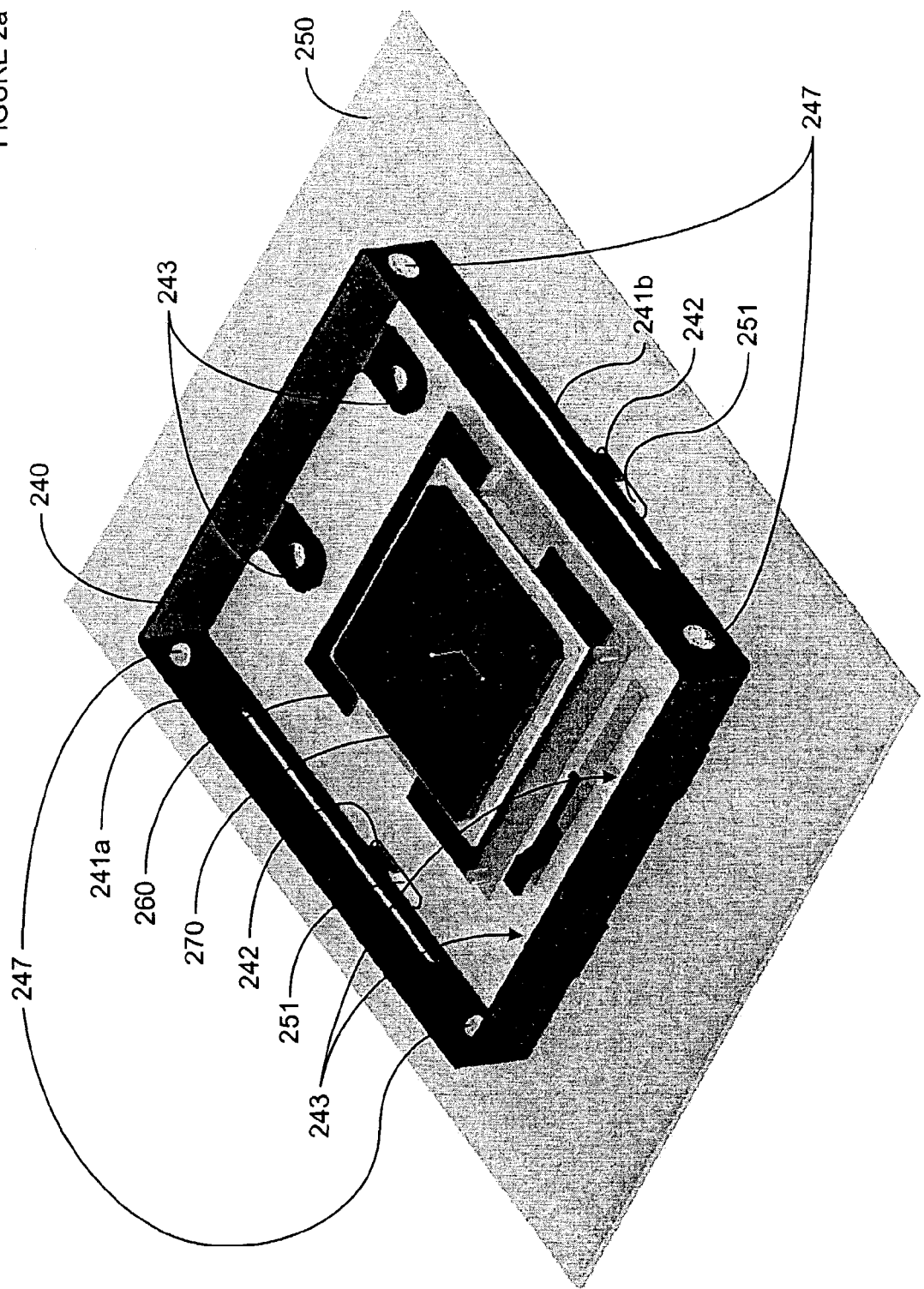
Figure 2C:
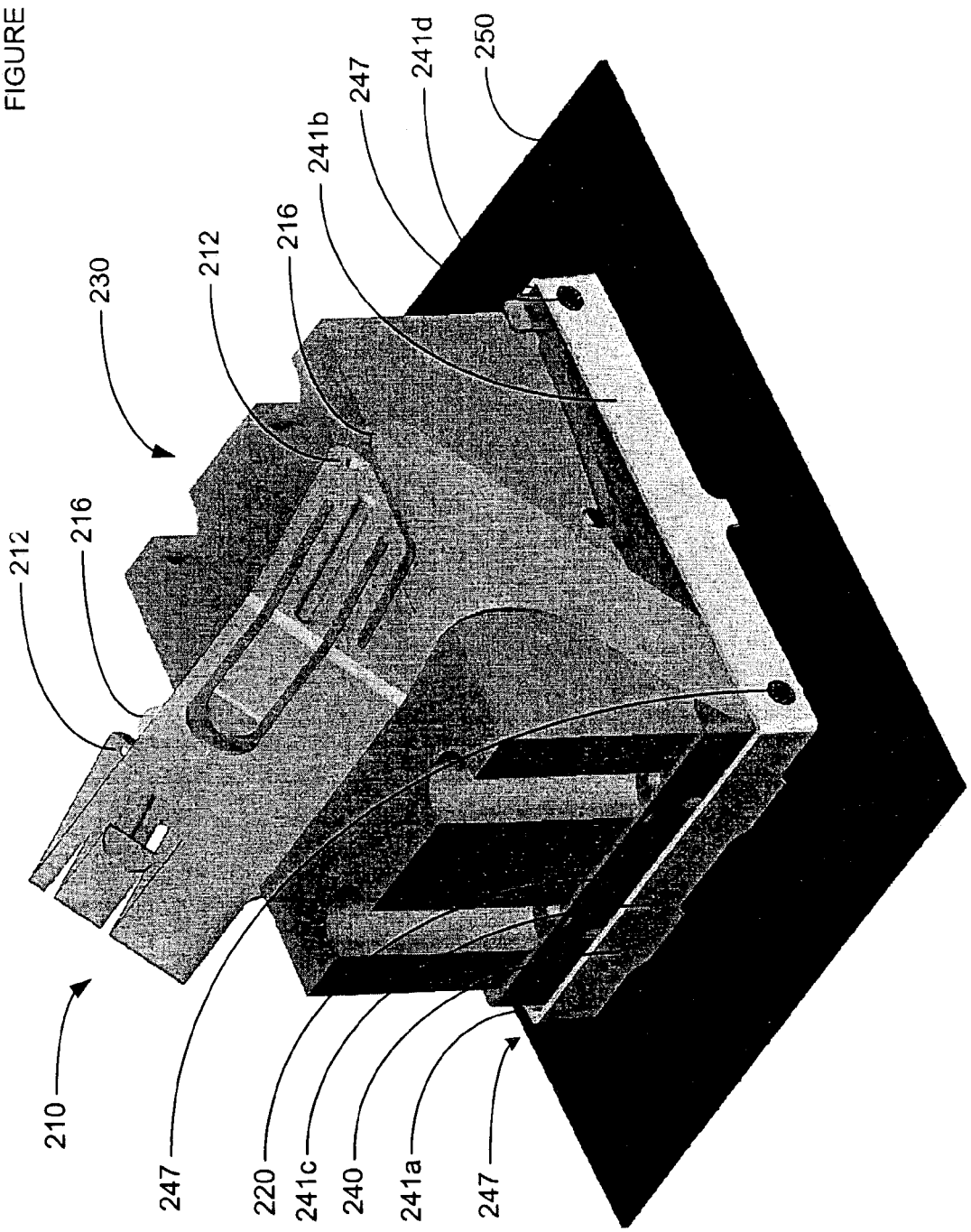

FIGS. 2a–2c depict embodiments of releasably retaining a heatsink using embodiments that include those of FIGS. 1a and 1b. As an aid to understanding and relating what is depicted in FIGS. 2a–2c to what is depicted in FIGS. 1a and 1b, the latter two digits of each 2xx label of FIGS. 2a–c are meant to correspond to the latter two digits of each 1xx label of FIGS. 1a and 1b. Not unlike as discussed with regard to actuation lever 110, spring cage 120 and retention module 140 of FIGS. 1a and 1b, actuation lever 210, spring cage 220 and retention module 240 cooperate to forcibly press a thermal conductive surface of a heatsink, in this case thermal conductive surface 235 of heatsink 230, against a surface of the package of an IC attached to a circuitboard (in this case IC 270 attached to circuitboard 250 via socket 260) to which retention module 240 may also be attached.

In FIG. 2a, retention module 240 is attached to circuitboard 250 to which IC 270 is also attached through socket 260. In some embodiments, retention module 240 may be attached to circuitboard 250 via circuitboard tabs 242 inserted into circuitboard slots 251 formed through circuitboard 250. In some variations of such embodiments, circuitboard tabs 242 may be a simple straight pieces of metallic material protruding through circuitboard slots 251 to be secured within circuitboard slots 251 via soldering. In other variations, circuitboard tabs 242 may be of the same hook-like configuration that circuitboard tabs 142 were depicted as being in FIG. 1a. As those skilled in the art will appreciate, circuitboard tabs 242 may be of many possible shapes and configurations. In other embodiments, retention module 240 may be attached to circuitboard 250 via fasteners inserted through openings formed through circuitboard tabs 243 and through circuitboard 250 underneath circuitboard tabs 243. Still other embodiments may employ any a variety of known ways to attach retention module 140 to a circuitboard, as those skilled in the art will readily recognize.

Formed through each end of frame portions 241a and 241b making up part of the generally rectangular frame of retention module 240 are retention openings 246, providing retention points to engage corresponding retention points on actuation lever 210 and spring cage 220. In some embodiments, various forms of retention hardware may be received through retention openings 246, such as pins 247 depicted as being inserted through each of retention openings 246, and perhaps secured in place by welding while protruding enough beyond retention openings 246 to engage retention points of actuation lever 210 and spring cage 220. Alternatively, in other embodiments, various forms of threaded fasteners, fasteners with expanding portions along a shaft, rivets, etc., may be inserted through each of retention openings 246.

In FIG. 2b, heatsink 230 is inserted within spring cage 220 causing the largely rectangular frame of spring cage 220 to surround the periphery of heatsink base 231. In a manner not unlike spring cage 120 and heatsink 130 of FIGS. 1a and 1b, portions of heatsink hard tabs 226 project upwardly through thermal conductive surface 235 into retention openings 233, and heatsink spring tabs 224 press downwardly onto ledge 232, tending to press heatsink 230 downwardly towards portions of heatsink hard tabs 226. Also, in some embodiments, heatsink tabs 227 may be formed in frame portions 221c and 221d making up the generally rectangular frame of spring cage 220 to engage heatsink base 231 to either tend to press heatsink 230 towards the center of spring cage 220 or to engage ledge 232 to aid in limiting possible upward movement of heatsink 230 relative to spring cage 220 and against heatsink spring tabs 224.

Formed through frame portions 221a and 221b near frame portion 221c and formed through actuator portions 216 of actuation lever 210 are pivot openings to form a pivoting connection between spring cage 220 and actuation lever 210. Actuation lever 210 is depicted as being pivoted relative to spring cage 220 such that lever portion 214 is pivoted away from spring cage 220 in preparation for engaging retention module 240 at retention points provided by retention notches 219 and 228 in a manner to be described more fully, later. Formed in one end of each of latch portions 211 attached to lever portion 214 of actuation lever 210 are latch tabs 212 to engage latch tabs 229 of spring cage 220 when actuation lever 210 is pivoted downwardly towards spring cage 220, pivoting-lever portion 214 closer to spring cage 220 as will be described more fully, later.

In FIG. 2c, the combination of actuation lever 210, spring cage 220 and heatsink 230 depicted in FIG. 2b is inserted within retention module 240 attached to circuitboard 250, thereby moving thermal conductive surface 235 of heatsink 230 towards contact with a surface of the package of IC 270, which is attached to circuitboard 250 via socket 260 as depicted in FIG. 2a. When the combination of actuation lever 210, spring cage 220 and heatsink 230 begins to be inserted within retention module 240, retention notches 228 of spring cage 220 engage a pair of pins 247 inserted in retention openings 246 formed through frame portions 241a and 241b of retention module 240 near frame portion 241d, to provide retention points to engage spring cage 220. The insertion of the combination of actuation lever 210, spring cage 220 and heatsink 230 into retention module 240 continues with retention notches of 219 of actuation lever 210 engaging the other pair of pins 247 inserted in retention openings 246 formed through frame portions 241a and 241b near frame portion 241c to provide retention points to engage actuation lever 210. The insertion of the combination of actuation lever 210, spring cage 220 and heatsink 230 into retention module 240 is completed by pivoting actuation lever 210 downwards towards spring cage 220 such that latch tabs 212 engage latch tabs 229, thereby latching actuation lever 210 into engagement with spring cage 220.

This pivoting of actuation lever 210 towards spring cage 220 serves to extend retention notches 219 and 228 of the actuation lever 210 an spring cage 220, respectively, further into engagement with whatever retention hardware is inserted through retention holes 246 of retention module 240, thereby serving to releasably connect the combination of actuation lever 210, spring cage 220 and heatsink 230 to retention module 240 at these retention points. This pivoting of actuation lever 210 towards spring cage 220 also serves to use the aforedescribed connection with retention module 240 to fully press spring cage 220 further into retention module 240, thereby pressing heatsink 230 towards circuitboard 250, and thereby pressing thermal conductive surface 235 of heatsink 230 into contact with a surface of the package of IC 270. The latching together of actuation lever 210 and spring cage 220 serves to latch both actuation lever 210 and spring 220 into their fully downward position, i.e., the position at which they are located at their closest desired location towards circuitboard 250. Heatsink spring tabs. 224 serve to transfer the downward force pressing spring cage 220 towards circuitboard 250 exerted by the engagement by spring cage 220 with both retention module 240 via retention slots 228 and actuation lever 210 via both the pivoting connection formed with spring cage 220 and the latching engagement of latching tabs 212 and 229. The springy nature of the transfer of force by spring cage 220 through spring tabs 224 and onto ledge 234 allows some "play" to compensate for mechanical imprecision in the combination of actuation lever 210, spring cage 220, heatsink 230 and retention module 240, as well as to compensate for mechanical imprecision in the shape or size of the package of IC 270. Heatsink hard tabs 226 serve to prevent the movement of thermal conductive surface 235 of heatsink 230 towards IC 270 beyond a predetermined point to prevent damage to IC 270. In those embodiments where heatsink tabs 227 are present, heatsink tabs 227 may serve to prevent the movement of thermal conductive surface 235 of heatsink 230 away from IC 270 beyond a predetermined point to prevent heatsink 230 from moving far enough away from IC 270 to overcome the ability of heatsink spring tabs 224 to press heatsink 230 towards IC 270 with the possible result of heatsink 230 slipping out of spring cage 220.

Figure 3A:
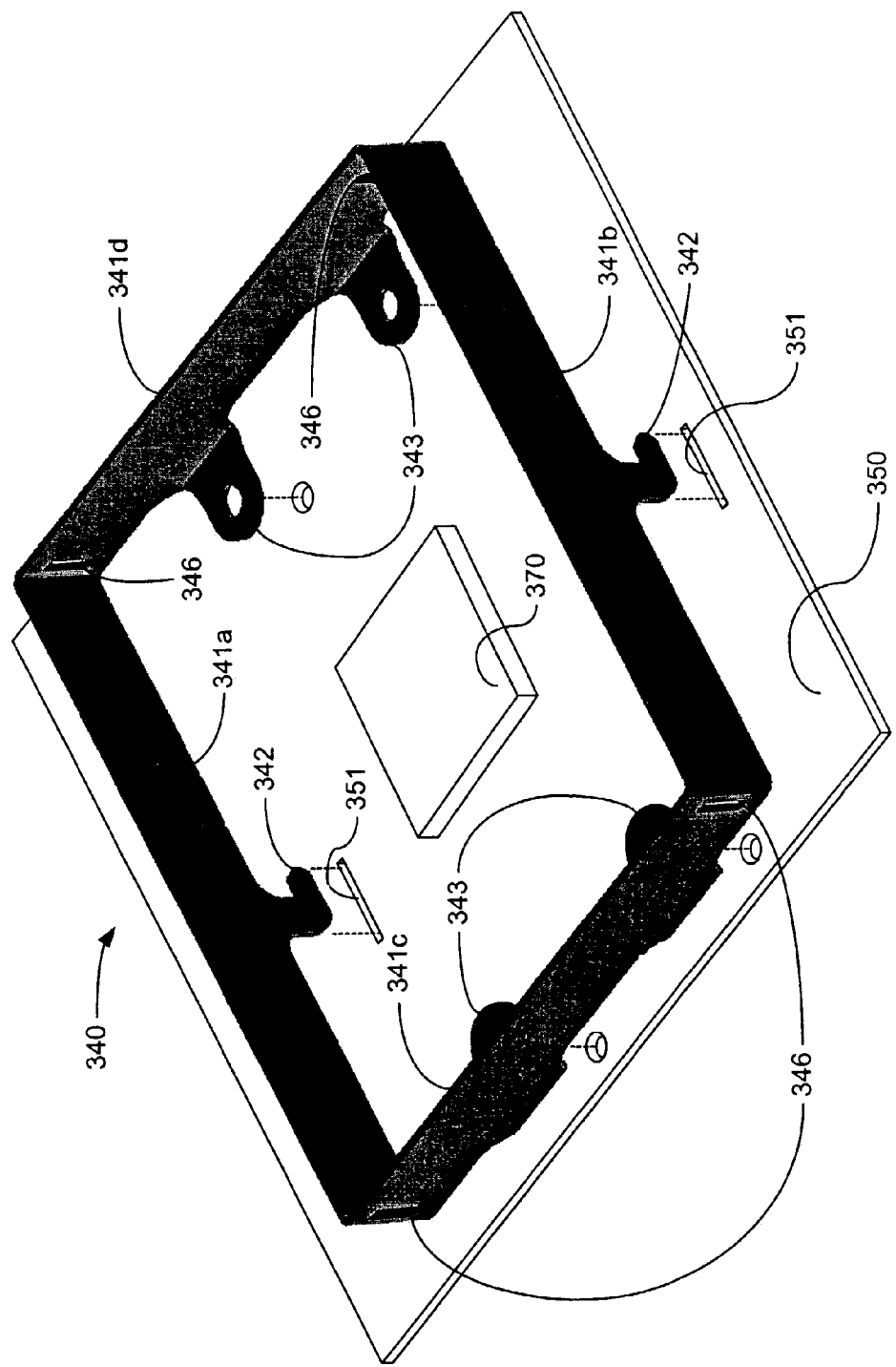
FIGS. 3*a*, 3*b* and 3*c* depict embodiments for assembly of another heatsink retainer.
Figure 3B:
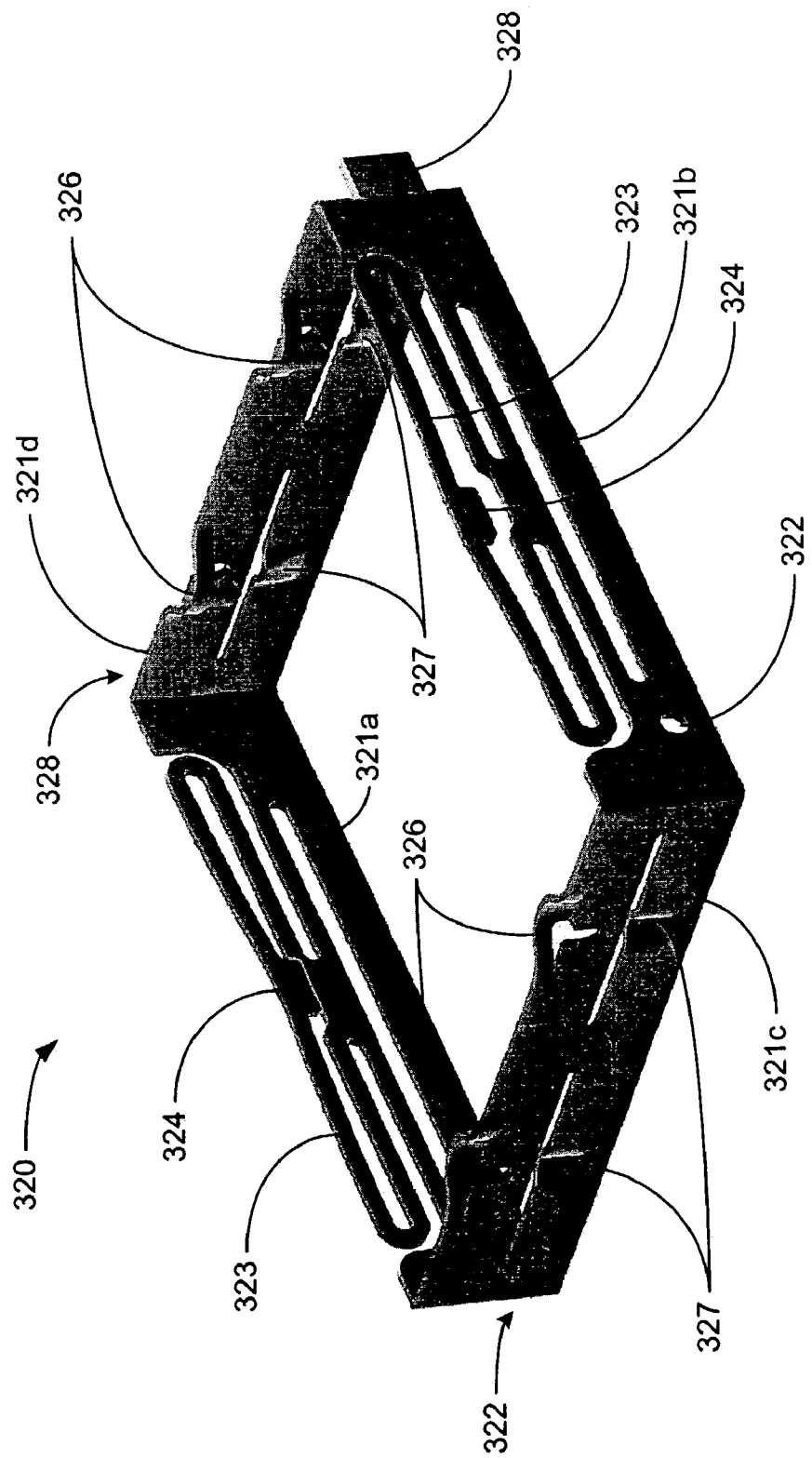
Figure 3C:
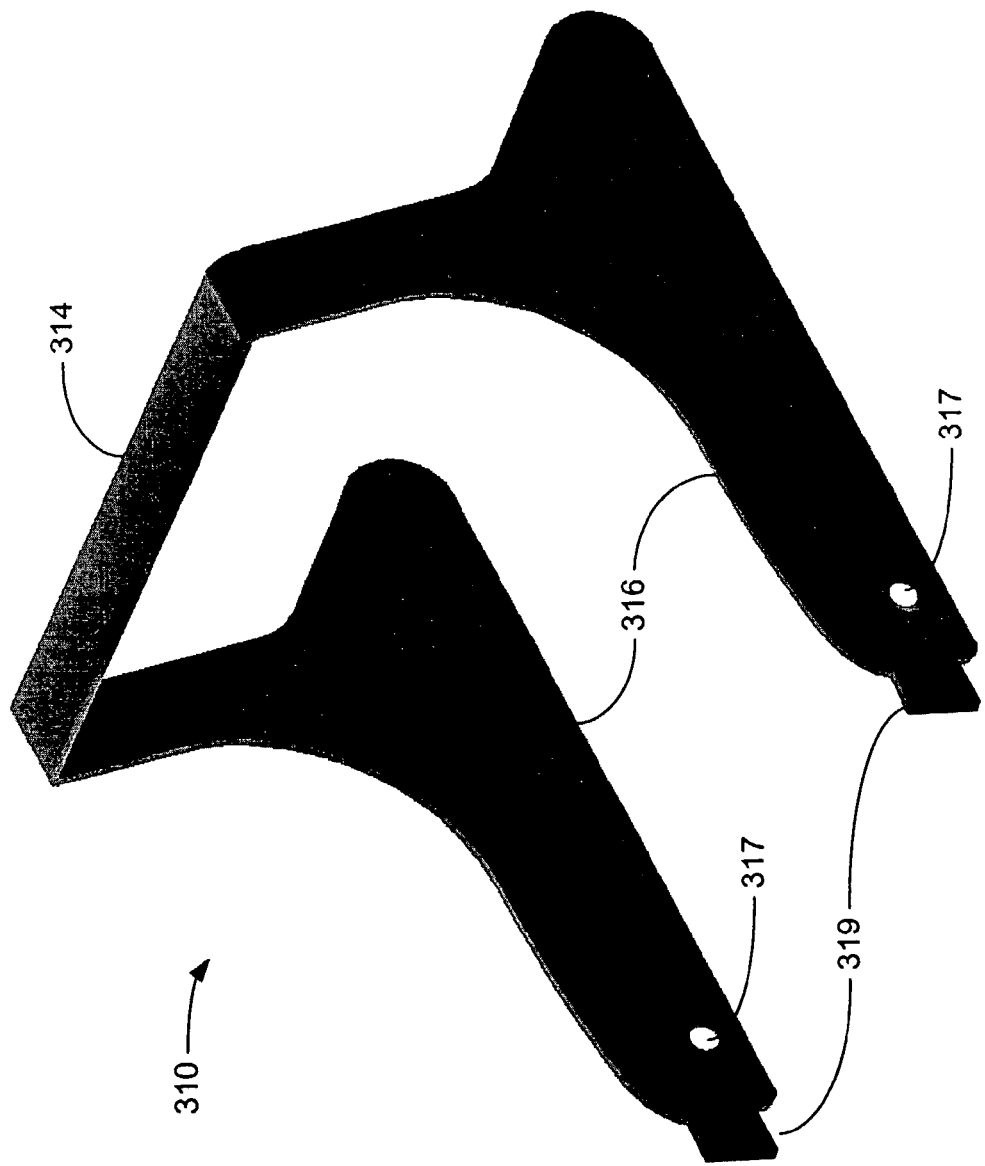

FIGS. 3a, 3b and 3c depict embodiments of another assembly for a heatsink retainer. Actuation lever 310, spring cage 320 and retention module 340 cooperate to forcibly press a thermal conductive surface of a heatsink, perhaps the thermal conductive surface of a heatsink like heatsink 130 of FIG. 1b, against a surface of the package of IC 370 attached to circuitboard 350 to which retention module 340 may also be attached.

Retention module 340 is made up principally of a four-sided frame having frame portions 341a–341d. Formed through each end of frame portions 341c and 341d are retention openings 346, providing retention points to receive retention tabs of spring cage 320 and actuation lever 310, as will be discussed in more detail, later. In some embodiments, retention module 340 may be attached to a circuitboard via circuitboard tabs 342. In other embodiments, retention module 340 may be attached to a circuitboard with any of a variety of fasteners inserted through openings formed through both circuitboard tabs 343 and a circuitboard at locations underneath each of circuitboard tabs 343. Still other embodiments may employ any a variety of known ways to attach retention module 340 to a circuitboard, as those skilled in the art will readily recognize.

Spring cage 320 is principally made up of a four-sided frame having frame portions 321a–321d and a pair of spring portions 323, each of spring portions 323 being attached to one of frame portions 321a and 321b. Formed through the end of each of frame portions 321a and 321b that connects with frame portion 321c are pivot openings 322 to aid in forming a pivoting connection with actuation lever 310. Where the other end of each of frame portions 321a and 321b connect with each end of frame portion 321d, forming a pair of adjacent corners, retention tabs 328 are formed providing retention points to engage with the pair of retention openings 346 formed through frame portion 341d of retention module 340. Heatsink spring tabs 324 are formed on each of spring portions 323 to cooperate with heatsink hard tabs 326 formed on each of frame portions 321c and 321d to releasably retain a heatsink.

Actuation lever 310 is made up principally of actuator portions 316 connected together at one end by lever portion 314. On the other end of each of actuator portions 316 are pivot openings 317 to cooperate with pivot openings 322 of spring cage 320 in forming a pivoting connection with spring cage 320. In one embodiment, a form of pivot hardware is received through pivot openings 317 and 322, such as pins 118 of FIG. 1a, which may be inserted through and secured within each of pivot openings 317 by welding in a position such that they protrude into and engage pivot openings 322. Alternatively, in other embodiments, rivets, various forms of threaded fasteners, fasteners with expanding portions along a shaft, or other pivot hardware may be inserted through pivot openings 317 and 322. Also, on the same end of each of actuator portions 316 as pivot openings 317 are retention tabs 319, providing retention points to engage with the pair of retention openings formed through frame portion 341c of retention module 340.

As part of retaining a thermal conductive surface of a heatsink, such as thermal conductive surface 135 of heatsink 130 of FIG. 1b, for example, in contact with IC 370 attached to circuitboard 350, retention module 340 is attached to circuitboard 350 at a location on the surface of circuitboard 350 causing frame portions 341a–341d to surround the location on the surface of circuitboard 350 to which IC 370 is attached. As discussed, earlier, in some embodiments, retention module 340 may be attached to a circuitboard via circuitboard tabs 342, while in other embodiments, retention module 340 may be attached to circuitboard 350 via fasteners inserted through openings formed through circuitboard tabs 343 and circuitboard 350 at locations underneath each of circuitboard tabs 343.

Heatsink 130 is inserted within spring cage 320 causing the largely rectangular frame of spring cage 320 to surround the periphery of heatsink base 131. Portions of heatsink hard tabs 326 project downwardly through ledge 132 and in retention openings 133, and heatsink spring tabs 324 press downwardly onto ledge 132. Also, in some embodiments, heatsink tabs 327 may be formed in frame portions 321c and 321d making up the generally rectangular frame of spring cage 320 to engage heatsink base 131 to tend to press heatsink 130 towards the center of spring cage 320.

Actuation lever 310 may be connected to spring cage 320 via any of a wide variety of types of pivot hardware, such as pins, rivets, etc., being inserted through pivot openings 317 and 322. In preparation for inserting the combination of actuation lever 310, spring case 320 and heatsink 130 into retention module 140, as will be described, lever portion 314 of actuation lever 310 is pivoted upwardly away from spring cage 320 in a manner not unlike that depicted regarding actuation lever 210 and spring cage 220 in FIG. 2b.

The combination of actuation lever 310, spring cage 320 and heatsink 330 is inserted within retention module 340 attached to circuitboard 350, thereby moving thermal conductive surface 135 of heatsink 130 towards contact with a surface of the package of IC 370 attached to circuitboard 350. When the combination of actuation lever 310, spring cage 320 and heatsink 230 begins to be inserted within retention module 340, retention tabs 328 of spring cage 320 engage the pair of retention openings 346 formed through frame portion 341d. The insertion of the combination of actuation lever 310, spring cage 320 and heatsink 130 into retention module 340 continues with retention tabs 319 of actuation lever 310 engaging the other pair of retention openings 346 formed through frame portion 341c. The insertion of the combination of actuation lever 310, spring cage 320 and heatsink 130 into retention module 340 is completed by pivoting of actuation lever 310 downwards towards circuitboard 350 such that lever portion 314 of actuation lever 310 is pivoted towards spring cage 320.

The pivoting of actuation lever 310 towards circuitboard 350 serves to fully press spring cage 320 further into retention module 340, thereby pressing heatsink 130 further towards circuitboard 350 and IC 370, and thereby pressing thermal conductive surface 135 of heatsink 130 into contact with IC 370. Heatsink spring tabs 324 serve to transfer the downward force pressing spring cage 320 further towards circuitboard 350 exerted by the engagement by spring cage 320 with both retention module 340 via retention tabs 328 and actuation lever 310 via the pivoting connection formed between spring cage 320 and actuation lever 310. The springy nature of the transfer of force from spring cage 320 to ledge 134 of heatsink 130 through spring tabs 324 allows some "play" to compensate for mechanical imprecision in the combination of actuation lever 310, spring cage 320, heatsink 130 and retention module 340, as well as to compensate for mechanical imprecision in the shape and/or size of the package of IC 370. Heatsink hard tabs 326 serve to prevent the movement of thermal conductive surface 135 of heatsink 130 away from IC 370 beyond a predetermined point to prevent heatsink 130 from moving far enough away from IC 370 to overcome the ability of heatsink spring tabs 324 to press heatsink 130 towards IC 370 with the possible result of heatsink 130 slipping out of spring cage 320.

Figure 4:
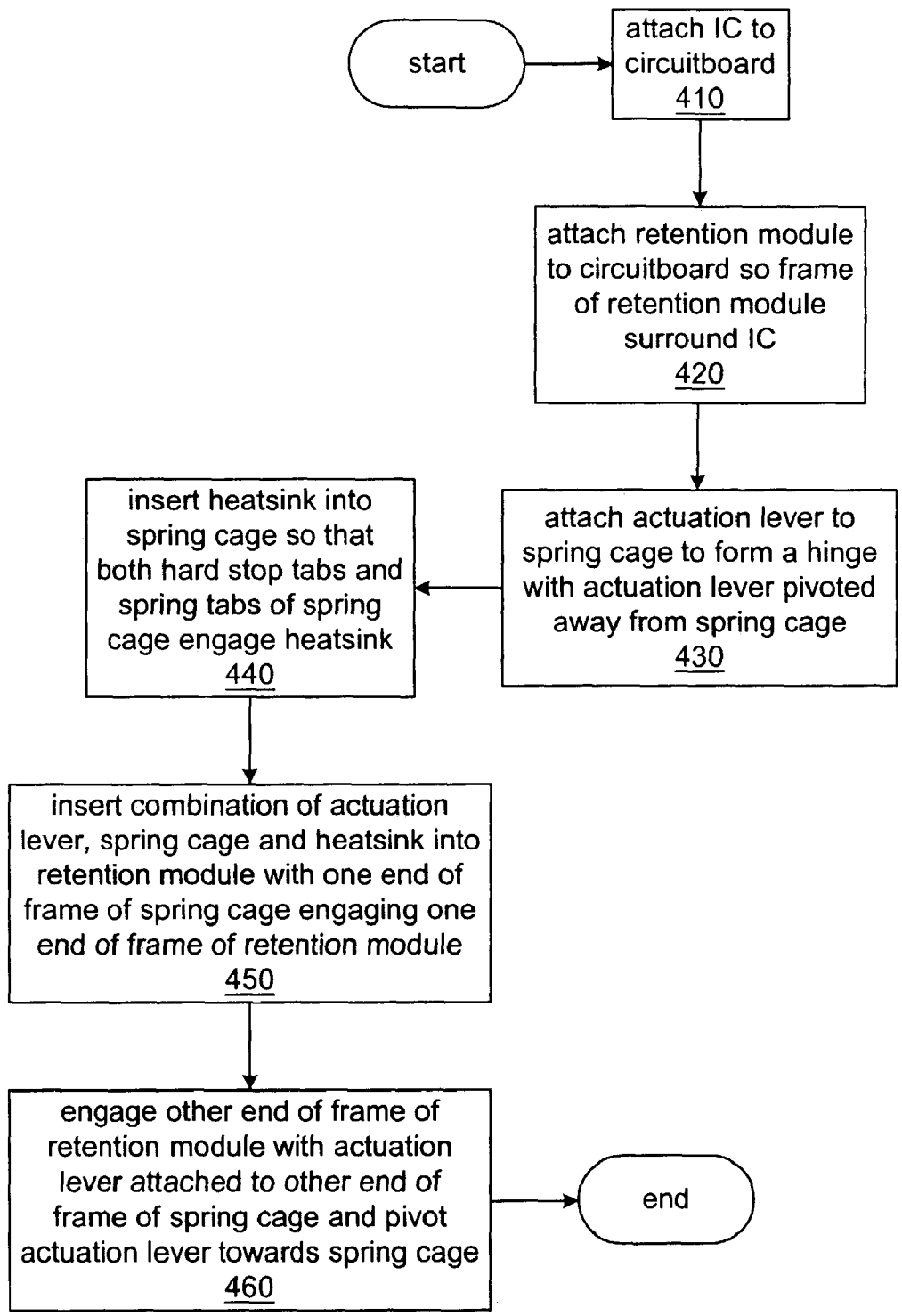
FIG. 4 depicts a flowchart of an embodiment of releasably retaining a heatsink.

FIG. 4 depicts a flowchart of an embodiment of retaining a heatsink in contact with an IC. An IC is attached to a circuitboard at 410, and at 420, a retention module is also attached to the circuitboard with its frame surrounding the location on the circuitboard to which the IC is attached to the circuitboard. An actuation lever is attached to a spring cage in such a way as to form a pivoting connection between the actuation lever and the spring cage where the two are connected, and a lever portion of the actuation lever is pivoted away from the spring cage at 430. At 440, a heatsink is inserted into the spring cage so that both the heatsink hard stop tabs and heatsink spring tabs of the spring cage engage the heatsink. The combination of the actuation lever, spring cage and heatsink are inserted into the retention frame attached to the circuitboard such that one end of the frame of the spring cage engages one end of the frame of the retention module at 450. At 460, the other end of the frame of the retention module is engaged with the actuation lever near to where the actuation lever has a pivoting connection with the end of the frame of the spring cage opposite the end of the frame of the spring cage engaging the retention module, and the lever portion of the actuation lever is pivoted at that pivoting connection towards the spring cage.

The teachings herein have been exemplified in conjunction with the preferred embodiment. Numerous alternatives, modifications, variations and uses will be apparent to those skilled in the art in light of the foregoing description. It will be understood by those skilled in the art that the invention as hereinafter claimed may be practiced in support of a wide variety of devices beyond an IC, and in support of a wide variety of heat releasing devices beyond a heatsink. Specifically, heat releasing devices including thermo-electric coolers, liquid heat exchangers, cooling fans, and heatsinks to which any of the foregoing have been attached may be supported in the practice of the present invention as hereinafter claimed.

What is claimed is:

1. An apparatus comprising:
a spring cage having a rectangular frame with four sides and four corners, having a first spring tab to engage a heatsink attached to a first side of the rectangular frame by a first spring portion, having a second spring tab to engage a heatsink attached to a second side of the rectangular frame by a second spring portion wherein the second side is opposite the first side, having a first retention point formed at a first corner of the rectangular frame, and having a second retention point formed at a second corner of the rectangular frame that is adjacent to the first corner;
an actuation lever having a first and second actuator portions, wherein both first and second actuator portions are of elongate shape having a first end and a second end, wherein the first ends of both the first and second actuator portions are connected together by a lever portion, wherein a first retention point is formed at the second end of the first actuator portion, wherein a second retention point is formed at the second end of the second actuator portion, and wherein pivot points are provided on both first and second actuator portions to cooperate with corresponding pivot points provided on the rectangular frame of the spring cage to form a pivoting connection between the actuation lever and the spring cage; and
a retention module having a rectangular frame having at least two circuitboard tabs to engage a circuitboard, having a first pair of retention points on the rectangular frame of the retention module to engage the first and second retention points of the rectangular frame of the spring cage, and having a second pair of retention points on the rectangular frame of the retention module to engage the first and second retention points of the actuator portions of the actuation lever.

2. The apparatus of claim 1, wherein the spring cage further comprises a first heatsink hard tab attached to a third side of the rectangular frame and a second heatsink hard tab attached to a fourth side of the rectangular frame, wherein the first and second heatsink hard tabs engage a heatsink to prevent the heatsink from moving closer than a predetermined distance towards a circuitboard to which the retention module is attached to prevent damage to an IC in contact with the heatsink.

3. The apparatus of claim 1, wherein the spring cage further comprises a first heatsink hard tab attached to a third side of the rectangular frame and a second heatsink hard tab attached to a fourth side of the rectangular frame, wherein the first and second heatsink hard tabs engage a heatsink to prevent the heatsink from moving beyond a predetermined distance away from a circuitboard to which the retention module is attached to prevent the heatsink from being pulled out of engagement with the first and second spring tabs.

4. The apparatus of claim 1, wherein each one of the first pair of retention points on the rectangular frame of the retention module is comprised of a retention opening formed through the rectangular frame of the retention module, each with a pin protruding therethrough, and the first and second retention points formed in the first and second corners of the rectangular frame of the spring cage are each a retention opening formed in the first and second corners to receive the pin protruding through a corresponding one of the retention openings comprising a corresponding one of the first pair of retention points on the rectangular frame of the retention module.

5. The apparatus of claim 1, wherein each one of the second pair of retention points on the rectangular frame of the retention module is comprised of a retention opening formed through the rectangular frame of the retention module, each with a pin protruding therethrough, and the first and second retention-points formed on the second end of each of the first and second actuator portions is a retention notch to each receive the pin protruding through a corresponding one of the retention openings comprising a corresponding one of the second pair of retention points on the rectangular frame of the retention module.

6. The apparatus of claim 1, wherein each one of the first pair of retention points on the rectangular frame of the retention module is comprised of a retention opening formed through the rectangular frame of the retention module, and the first and second retention points formed at the first and second corners of the rectangular frame of the spring cage are each a retention tab to protrude into a corresponding one of the retention openings comprising a corresponding one of the first pair of retention points on the rectangular frame of the retention module.

7. The apparatus of claim 1, wherein each one of the second pair of retention points on the rectangular frame of the retention module is comprised of a retention opening formed through the rectangular frame of the retention module, and the first and second retention points formed on the second end of each of the first and second actuator portions are each a retention tab to protrude into a corresponding one of the retention openings comprising a corresponding one of the second pair of retention points on the rectangular frame of the retention module.

8. The apparatus of claim 1, wherein the pivot points on the first and second actuator portions of the actuation lever are each pivot openings formed through the first and second actuator portions, wherein the corresponding pivot points on the rectangular frame of the spring cage are each pivot openings formed through the rectangular frame of the spring cage, and the pivoting connection between the actuation lever and the rectangular frame of the spring cage is formed with insertion of pieces of pivot hardware through the pivot openings of the first and second actuator portions and corresponding pivot openings of the rectangular frame of the spring cage.

9. The apparatus of claim 8, wherein the pieces of pivot hardware are each rivets.

10. The apparatus of claim 1, wherein the pivoting connection between the actuation lever and the rectangular frame of the spring cage is comprised of a pair of double-flush engagements, each created with a pierced extrusion through the rectangular frame of the spring cage staked into a countersink formed in a corresponding one of the two actuator portions of the actuation lever.

11. The apparatus of claim 1, further comprising a circuitboard to which the retention module is attached.

12. The apparatus of claim 11, further comprising an IC attached to the circuitboard on the same surface as that to which the retention module is attached and positioned on that surface at a location within the location of the retention module such that the rectangular frame of the retention module surrounds the IC.

13. An apparatus comprising:
a spring cage having a rectangular frame with four sides and four corners, having a first spring tab to engage a heatsink attached to a first side of the rectangular frame by a first spring portion, having a second spring tab to engage a heatsink attached to a second side of the rectangular frame by a second spring portion wherein the second side is opposite the first side, having a first heatsink hard tab to engage a heatsink attached to a third side of the rectangular frame, having a second heatsink hard tab to engage a heatsink attached to a fourth side of the rectangular frame wherein the fourth side is opposite the third side, having a first retention point to engage a retention module attached to a circuitboard formed at a first corner of the rectangular frame, and having a second retention point to engage a retention module attached to a circuitboard formed at a second corner of the rectangular frame that is adjacent to the first corner; and
an actuation lever having a first and second actuator portions, wherein both first and second actuator portions are of elongate shape having a first end and a second end, wherein the first ends of both the first and second actuator portions are connected together by a lever portion, wherein a first retention point to engage a retention module attached to a circuitboard is formed at the second end of the first actuator portion, wherein a second retention point to engage a retention module attached to a circuitboard is formed at the second end of the second actuator portion, wherein pivot points are provided on both first and second actuator portions to cooperate with corresponding pivot points provided on the rectangular frame of the spring cage to form a pivoting connection between the actuation lever and the spring cage, and wherein at least one latch tab is attached to the lever portion and is positioned to engage at least one corresponding latch tab attached to the rectangular frame of the spring cage to latch together the actuation lever and the spring cage when the lever portion of the actuation lever is pivoted towards the spring cage.

14. The apparatus of claim 13, wherein the first and second retention points formed in the first and second corners of the rectangular frame of the spring cage are each a retention opening formed in the first and second corners to each receive a corresponding pin protruding from a rectangular frame of a retention module.

15. The apparatus of claim 13, wherein the first and second retention points formed on the second end of each of the first and second actuator portions is a retention notch to each receive a corresponding pin protruding from a rectangular frame of a retention module.

16. The apparatus of claim 13, wherein the first and second retention points formed at the first and second corners of the rectangular frame of the spring cage are each a retention tab to protrude into a corresponding retention opening formed through the rectangular frame of a retention module.

17. The apparatus of claim 13, wherein the first and second retention points formed on the second end of each of the first and second actuator portions are each a retention tab to protrude into a corresponding retention opening formed through the rectangular frame of a retention module.

18. The apparatus of claim 13, wherein the pivot points on the first and second actuator portions of the actuation lever are each pivot openings formed through the first and second actuator portions, wherein the corresponding pivot points on the rectangular frame of the spring cage are each pivot openings formed through the rectangular frame of the spring cage, and the pivoting connection between the actuation lever and the rectangular frame of the spring cage is formed with the insertion of pieces of pivot hardware through the pivot openings of the first and second actuator portions and corresponding pivot openings of the rectangular frame of the spring cage.

19. The apparatus of claim 18, wherein the pieces of pivot hardware are each rivets.

20. The apparatus of claim 13, wherein the pivoting connection between the actuation lever and the rectangular frame of the spring cage is comprised of a pair of double-flush engagements, each created with a pierced extrusion through the rectangular frame of the spring cage staked into a countersink formed in a corresponding one of the two actuator portions of the actuation lever.

21. The apparatus of claim 13, further comprising a retention module having a rectangular frame having at least two circuitboard tabs to engage a circuitboard, having a first pair of retention points on the rectangular frame of the retention module to engage the first and second retention points of the rectangular frame of the spring cage, and having a second pair of retention points on the rectangular frame of the retention module to engage the first and second retention points of the actuator portions of the actuation lever.

22. The apparatus of claim 21, further comprising a circuitboard to which the retention module is attached.

23. The apparatus of claim 22, further comprising an IC attached to the circuitboard on the same surface as that to which the retention module is attached and positioned on that surface at a location within the location of the retention module such that the rectangular frame of the retention module surrounds the IC.

* * * * *